(12) United States Patent
Coppola et al.

(10) Patent No.: US 12,408,275 B2
(45) Date of Patent: Sep. 2, 2025

(54) METHOD FOR MANUFACTURING MULTICOLOURED PRINTED CIRCUITS FOR SMART CARD MODULES

(71) Applicant: Linxens Holding, Mantes la Jolie (FR)

(72) Inventors: Mara Coppola, Mantes la Jolie (FR); Nicolas Michaudet, Mantes la Jolie (FR); Patrice Glaris, Mantes la Jolie (FR)

(73) Assignee: Linxens Holding, Mantes-la-Jolie (FR)

( * ) Notice: Subject to any disclaimer, the term of this patent is extended or adjusted under 35 U.S.C. 154(b) by 0 days.

(21) Appl. No.: 18/579,406

(22) PCT Filed: Jul. 11, 2022

(86) PCT No.: PCT/EP2022/069345
§ 371 (c)(1),
(2) Date: Jan. 15, 2024

(87) PCT Pub. No.: WO2023/285395
PCT Pub. Date: Jan. 19, 2023

(65) Prior Publication Data
US 2025/0089175 A1 Mar. 13, 2025

(30) Foreign Application Priority Data
Jul. 16, 2021 (FR) ...................................... 2107729

(51) Int. Cl.
*H05K 3/00* (2006.01)
*G06K 1/02* (2006.01)
(Continued)

(52) U.S. Cl.
CPC ............. *H05K 3/0014* (2013.01); *G06K 1/02* (2013.01); *G06K 19/07722* (2013.01); *G06K 19/07743* (2013.01); *H05K 3/22* (2013.01)

(58) Field of Classification Search
CPC ... H05K 3/0014; G06K 1/02; G06K 19/07722
(Continued)

(56) References Cited

U.S. PATENT DOCUMENTS

| 5,688,573 A | 11/1997 | Goeb et al. ................... 428/40.1 |
| 6,188,028 B1 * | 2/2001 | Haba .................... H01R 12/523 361/791 |

(Continued)

FOREIGN PATENT DOCUMENTS

| DE | 19523242 A1 | 1/1997 |
| WO | WO 97/31323 A1 | 8/1997 |

*Primary Examiner* — Allyson N Trail
(74) *Attorney, Agent, or Firm* — McCarter & English LLP

(57) ABSTRACT

A method for manufacturing flexible printed circuits for smart card modules, wherein a complex material is provided. This complex material includes an assembly including at least two different-colored strata. Zones of this assembly are visible through the layer of electrically conductive material. This manufacturing method includes an operation that consists in laser etching at least one of the two different-colored strata over a portion of that zone of the assembly of strata that is left visible, so as to reveal the color of the other of the two different-colored strata. Printed circuit manufactured by this method. Module and smart card including this printed circuit.

16 Claims, 4 Drawing Sheets

(51) Int. Cl.
*G06K 19/077* (2006.01)
*H05K 3/22* (2006.01)

(58) Field of Classification Search
USPC .......................................................... 235/492
See application file for complete search history.

(56) References Cited

U.S. PATENT DOCUMENTS

| | | | |
|---|---|---|---|
| 6,259,035 B1 | 7/2001 | Truggelmann et al. | 174/250 |
| 2013/0320095 A1* | 12/2013 | Blum | G06K 19/02 |
| | | | 235/488 |
| 2016/0224879 A1* | 8/2016 | Amarnath | G06F 3/0689 |
| 2020/0250504 A1 | 8/2020 | Lotya et al. | |
| 2021/0174159 A1* | 6/2021 | Finn | G06K 19/0726 |
| 2024/0094252 A1* | 3/2024 | Li | G01R 1/06716 |

\* cited by examiner

[Fig 1]
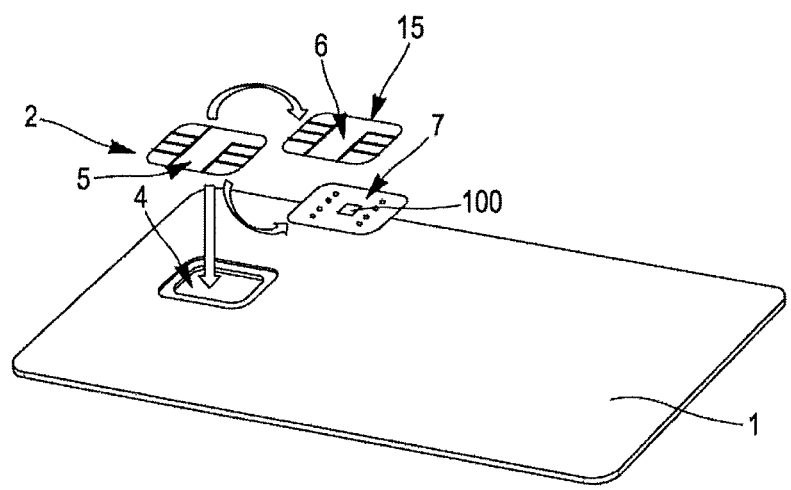

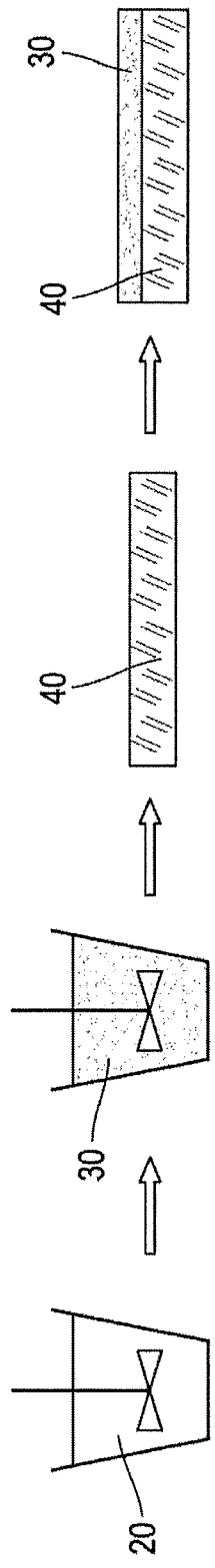

[Fig 5]
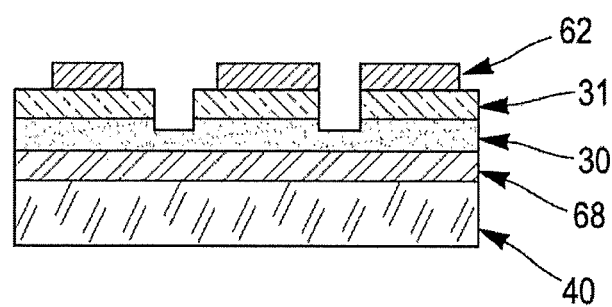
[Fig 6]
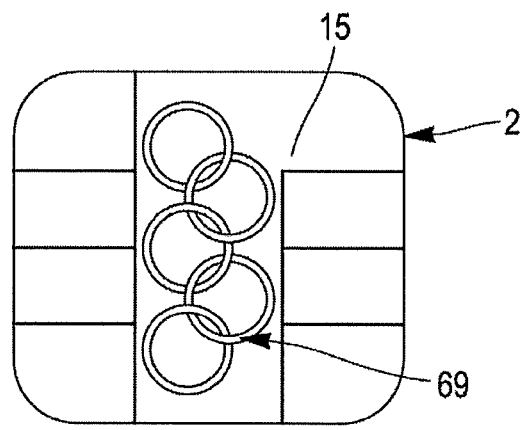

METHOD FOR MANUFACTURING MULTICOLOURED PRINTED CIRCUITS FOR SMART CARD MODULES

CROSS REFERENCE TO RELATED APPLICATION

This patent application is a U.S. National Stage application of International Patent Application Number PCT/EP2022/069345 filed Jul. 11, 2022, which is hereby incorporated by reference in its entirety, and claims priority to FR 2107729 filed Jul. 16, 2021.

TECHNICAL FIELD

The invention relates to the field of electronic modules for smart cards and to methods for manufacturing flexible printed circuits used to produce electronic modules for smart cards.

PRIOR ART

As shown in FIG. 1, smart cards are generally made up of a rigid support 1 made of PVC, PVC/ABS or polycarbonate type plastic material forming most of the card, with a cavity 4 in which there is incorporated an electronic module 2 manufactured separately. In FIG. 1, the module 2 is also shown seen from its front face 6 (at the top) and turned over to see its rear face 7 (at the bottom). This electronic module 2 comprises an electronic chip 100 (integrated circuit). Transmission means make it possible to transmit data from the chip 100 to a card reader device (reading) or from this device to the card (writing). These data transmission means can be "contact", "contactless" or "dual" when they combine the two preceding means. In a "contact" smart card, a connector 5 formed from a printed circuit comprises, on the front face 6 of the connector 5, contact lands 15 electrically connected to the chip 100 and flush with the surface of the card support 1, for connection, by means of electrical contact, to a card reader device. In a "dual" smart card, in addition to the connector 5, at least one antenna is provided, generally in the card body, for contactless connection with a card reader device (in addition, the smart card comprises inductive or electrical connection means for establishing communication between the antenna and the chip supported by the module 2). This document will focus essentially on modules 2 for "contact" or "dual" smart cards.

In the prior art, smart card modules 2 are generally formed from a dielectric substrate covered, on at least one of its faces 6, 7, with a sheet of electrically conductive material, consisting for example of a metal such as copper, steel or aluminum or an alloy of one of these metals. Formed in this sheet of electrically conductive material are conducting tracks which, in the case of some of them, at least on the front face 6, form the electrical contact lands 15. The dielectric substrates used in the prior art are made of composite materials (glass-epoxy) or plastic materials (PET, PEN, polyimide, etc.). This type of dielectric substrate is generally thin (its thickness is, for example, of the order of 100 μm) in order to maintain flexibility compatible with continuous ("reel-to-reel" or "roll-to-roll") methods for manufacturing electronic modules.

In a method for manufacturing flexible printed circuits for smart card modules, a complex material formed of several layers or sheets stacked and assembled in the direction corresponding to its smallest dimension (i.e. its thickness) is provided. This complex material therefore has the shape of a thin board or strip, with two main faces. This thin board or this strip is flexible so as to be able to be curved in a direction perpendicular to its main faces and notably so as to be compatible with a continuous manufacturing method.

The complex material forms an assembly comprising at least two different-colored strata of dielectric material. For example, this assembly comprises at least one dielectric substrate with at least one layer of dielectric material deposited on one of the main faces of the dielectric substrate. At least one layer of electrically conductive material rests on the assembly comprising at least two different-colored strata of dielectric material (the complex material may in fact comprise, for example, a layer of electrically conductive material on the front face and a layer of electrically conductive material on the rear face).

In this complex material, contacts are formed in the layer of electrically conductive material. These contacts are intended to establish an electrical connection with a smart card reader. As a result, at least between these contacts, the assembly comprising at least two different-colored strata of dielectric material is visible in at least one zone which corresponds to the space necessary between the contacts in order to insulate them from one another. The visible zone may also correspond to a space etched in the layer of electrically conductive material to form a pattern such as a logo for example.

According to one example, in the assembly comprising at least two different colored strata of dielectric material, the substrate and the additional layer or layers of dielectric material each form a stratum of dielectric material. In this document, a "stratum" (i.e. a stratum of dielectric material) may consist of a layer of dielectric material, adhesive or otherwise, of the dielectric substrate itself, of a reinforcing layer, etc. Thus, although the layer or layers of electrically conductive material form part of the complex material, they do not constitute colored strata of dielectric material within the meaning of this document.

Document FR3040516A1 describes a method in which the contacts are formed in a layer of electrically conductive material while revealing a layer of tinted adhesive material underlying the layer of electrically conductive material. In this case, the layer of tinted adhesive material rests, for example, on a dielectric substrate. This prior art document therefore discloses a complex material with two strata of different colors: the color of the dielectric substrate and the color of the layer of tinted adhesive. However, since the layer of tinted adhesive covers the dielectric substrate, only the color of the layer of tinted adhesive is visible through the spaces arranged in the layer of electrically conductive material.

In order to propose modules with more complex colored patterns, the inventors have sought to obtain more colors in the zone or zones visible through the spaces or cutouts made in the layer of electrically conductive material.

BRIEF DESCRIPTION OF THE INVENTION

To this end, the inventors propose adding, to the methods of the prior art, at least an operation that consists in laser etching at least one of the two different-colored strata over a portion of that zone of the assembly comprising at least two different-colored strata of dielectric material that is left visible, so as to reveal the color of the other of the two different-colored strata.

In other words, in a zone that is left visible through the layer of electrically conductive material, a part of a colored layer or stratum lying beneath the layer of electrically conductive material is removed by means of a laser beam so as to reveal another color corresponding to another colored layer or stratum situated beneath the one that lies beneath the layer of electrically conductive material.

It is thus possible to create patterns having at least two different colors (in addition to the color of the layer of electrically conductive material itself).

It should be noted that these colors are not necessarily visible in daylight. Indeed, the colors may come from photochromic agents sensitive to light having wavelengths in, for example, the ultraviolet or infrared. For examples of photochromic agents, reference may be made, for example, to document FR3063414A1. The different colors of the strata underlying the layer of electrically conductive material are then revealed when the module is exposed to these particular wavelengths. These types of properties can be used notably to prevent, or at least to make more difficult, the falsification of the smart card modules.

The colors may come from heat-sensitive thermochromic agents. Such agents may change color, permanently or otherwise, as a function of temperature.

Thus, in this document, the color of the different-colored strata may be derived either from the original color of the material constituting each of these strata, or from a coloring agent, substance or material, or from a photochromic agent, substance or material (for example, a fluorescent or phosphorescent agent, substance or material), or a thermochromic agent, substance or material. The coloring, photochromic or thermochromic agent, substance or material may be a "dye" or a "pigment". In this document:
- a "dye" means a material soluble in the medium (for example the material of the layer of dielectric and possibly adhesive material) into which it is introduced (the dye is said to be dissolved in the medium);
- a "pigment" means a material insoluble in the medium (for example the material of the layer of dielectric and possibly adhesive material) into which it is introduced (the pigment is said to be dispersed in the medium).

The method according to the invention may also include one or other of the following features, each considered individually or in combination with one or more others:
- that zone of the assembly comprising at least two different-colored strata of dielectric material that is left visible is obtained by photolithography and electrochemical etching of the layer of electrically conductive material; alternatively or in addition, that zone of the assembly comprising at least two different-colored strata of dielectric material that is left visible is obtained by laser etching of the layer of electrically conductive material; and
- the method comprises a step of piercing holes in the assembly comprising at least two different-colored strata of dielectric material, prior to a step of laminating the layer of electrically conductive material, during which step at least some of the holes are at least partially blinded by the layer of electrically conductive material in order to form blind holes or plated through-holes; alternatively, the layer of electrically conductive material is colaminated with the assembly comprising at least two different-colored strata of dielectric material and at least some of the holes are made through the assembly of strata using a laser, starting from the free surface of the dielectric substrate and stopping the laser perforation when the layer of electrically conductive material is reached.

Depending on the nature, the number and/or the thickness of the various super posed strata, notably if these strata are formed of an adhesive material, a problem of creep of the adhesive material into the holes may arise. This can compromise a reliable connection of a connecting wire (using the wire bonding technique) on the inner face of the layer of electrically conductive material, at the bottom of the blind holes. This problem of creep can also compromise the connection with the layer of electrically conductive material when a conductive layer is deposited by electroplating on the wall of the holes ("plated through-hole" technique). This problem is possibly at least partially solved by depositing a reinforcing layer between two strata, for example between the dielectric substrate and at least one of the layers of adhesive material.

The invention also relates to a printed circuit for a smart card module comprising a complex material having two main faces, this complex material comprising an assembly comprising at least two different-colored strata of dielectric material and at least one layer of electrically conductive material resting on the assembly comprising at least two different-colored strata of dielectric material, in which layer of electrically conductive material there are formed contacts intended to establish an electrical connection with a smart card reader, and between which contacts the assembly comprising at least two different-colored strata of dielectric material is visible in at least two zones.

This printed circuit comprises at least one color in one of the two zones that are left visible, and at least one other color in the other of the two zones that are left visible.

The printed circuit according to the invention may also include one or other of the following features, each considered individually or in combination with one or more others:
- the complex material comprises a flexible dielectric substrate and at least one layer of adhesive dielectric material resting on the dielectric substrate;
- the complex material comprises a flexible dielectric substrate, at least one layer of adhesive dielectric material and at least one reinforcing layer inserted between the flexible dielectric substrate and the layer of adhesive dielectric material;
- the complex material comprises at least two layers of adhesive dielectric material of different apparent colors; and
- each layer of adhesive dielectric material has a thickness greater than or equal to 7 microns; for example, each layer of adhesive dielectric material has a thickness greater than or equal to 10 microns (with a tolerance of plus or minus 3 microns) and possibly less than or equal to 20 microns (with a tolerance of plus or minus 3 microns).

According to yet another aspect, the invention relates to a smart card module comprising a printed circuit according to the invention. Such a module notably comprises an electronic chip and holes punched through the thickness of the assembly comprising the substrate and the layer or layers of dielectric material. These holes are at least partially blinded by the layer of electrically conductive material. The chip is connected via these holes (blind holes or plated through-holes) to contacts formed in the layer of electrically conductive material. Optionally, the complex material comprises more than one layer of adhesive dielectric material, each layer of adhesive dielectric material having a different color.

According to yet another aspect, the invention relates to a smart card comprising a card body, a cavity formed in the card body and a module housed in the cavity. This module then comprises a printed circuit according to the invention and the total thickness of the module (including the encapsulation material coating the chip and its possible connections to the contacts) is less than or equal to 580 µm. This thickness may, for example, be less than or substantially equal to 540 µm.

BRIEF DESCRIPTION OF THE FIGURES

Other features and advantages of the invention will become apparent on reading the detailed description and from the appended drawings, in which:

FIG. 1 schematically depicts, in perspective, a smart card intended to receive a module comprising a printed circuit;

FIGS. 2a to 2l schematically and successively depict different steps of an example of a method for manufacturing a printed circuit;

FIG. 5 schematically illustrates, in cross section, an example of laser-etched strata; and FIG. 6 schematically depicts one example of a module obtained by a method such as those described in relation to FIGS. 2 to 5.

DETAILED DESCRIPTION

Figure 3A:
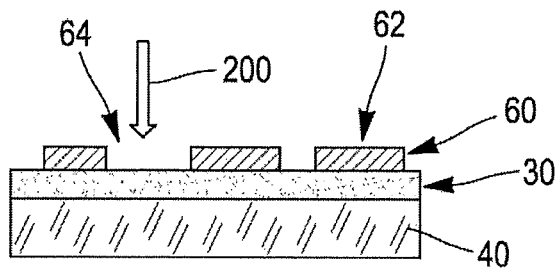
FIG. 3 illustrates schematically, in cross section, an example of a step of laser etching strata.

One example of a method according to the invention for manufacturing a printed circuit for a smart card module is described below.

As depicted in FIG. 1, a smart card 1 comprises a module 2. The module 2 comprises a connector 5 formed from a flexible printed circuit. This connector is provided with a chip 100. The module 2 is generally made in the form of a separate element which is inserted into a cavity 4 made in the card 1. If the smart card is a "dual" card, the module 2 is possibly connected to an antenna when it is inserted into the cavity 4. Alternatively, still in the case of a "dual" card, the module 2 comprises an antenna intended to be inductively coupled to another antenna integrated in the body of the smart card 1.

The connector 5 comprises several contact lands 15 to which the chip 100 is connected. The connector 5 is depicted (at the top) as seen from its front face 6 (contact face). It is also depicted (at the bottom) as seen from its rear face 7 or "bonding side". The connector 5 thus depicted corresponds to a single-sided connector 5 for a "contact" card. However, it could just as well be a single-sided or double-sided connector 5, for a "dual" card for example.

FIGS. 2a to 2l schematically illustrate different steps of an example of the im
plementation of a method for the manufacture of the flexible printed circuit.

This method includes providing (FIG. 2a) an adhesive or an adhesive dielectric material 20, in liquid form. The adhesive dielectric material 20 consists, for example, of an epoxy resin, possibly modified. At this stage, the adhesive dielectric material 20 is, for example, naturally transparent and pale yellow in color.

In the next step (FIG. 2b), a coloring agent (i.e., a "dye" or a "pigment" as defined above) is added to the pre-formulated adhesive dielectric material 20. The adhesive dielectric material 20 may or may not be colored, depending on the nature of the coloring agent. Indeed, it is possible that the coloring agent may not color the adhesive dielectric material 20 without photonic activation. This coloring agent may be organic or inorganic. It may tint the adhesive dielectric material 20 for example in red, magenta, blue, green, orange, gray, black, etc. or may not apply coloration when illuminated by light whose spectrum is in the visible range. If the coloring agent is of a pigmentary nature, it may be a pigment or a mixture of several pigments, in powder or pigment predispersion (also with one or more pigments). For example, it may be an ink such as those used in the manufacture of banknotes.

In the next step (FIG. 2c), a dielectric substrate 40 is provided (FIG. 2c). The dielectric substrate 40 is intended to form a stratum of one color. The material of the dielectric substrate 40 is, for example, glass-epoxy. It can be opaque or transparent. The use of an opaque substrate may make it possible to mask the chip 100 and its wiring underlying the zone which it is desired to see colored. This dielectric material 40 is generally sold in black, gray, yellow, green or white color, for example. Other colors may be obtained. Its thickness is, for example, in the vicinity of 100 µm.

In the next step (FIG. 2d), the dielectric substrate 40 is coated with the adhesive dielectric material obtained in the step corresponding to FIG. 2b. A first layer of dielectric material 30 is thus formed. The first layer of dielectric material 30 is intended to form a stratum of a different color from that of the dielectric substrate 40. It has, for example, a thickness of between 10 and 70 µm after drying, and more preferably of between 10 and 20 µm after drying, for example it has a thickness of 15 µm, to within a tolerance of 3 µm.

After drying, the assembly consisting of the dielectric substrate 40 and the first layer of dielectric material 30 is punched right through (FIG. 2e), for example mechanically by punching, to form holes 42 corresponding to connection wells and possibly openings for receiving one or more electronic components.

A sheet of electrically conductive material is brought into contact with the first layer of dielectric material 30 (FIG. 2f). This sheet thus forms a layer of electrically conductive material 60 resting on the substrate 40. The layer of electrically conductive material 60 covers holes 42. The assembly consisting of the layer of electrically conductive material 60, of the first layer of dielectric material 30 and of the dielectric substrate 40 is laminated to form a complex material. The first layer of dielectric material 30 is cross-linked in an oven (FIG. 2g).

Resin patterns 72 are produced by photolithography on the layer of electrically conductive material 60, by deposition or insolation (FIG. 2h) and development of a photosensitive resin 70 (FIG. 2i).

A step of electrochemically etching patterns makes it possible to produce pat
terns 62 in the layer of electrically conductive material 60 (FIG. 2j), these corresponding to those defined by the resin 72 in the preceding step. Spaces 64 between the different elements of the patterns 62 (contacts, logos, etc.) are etched in the layer of electrically conductive material 60 and the layer of adhesive material 30 becomes visible in these spaces 64.

The resin protecting the patterns 62 during etching is removed (FIG. 2k) and finishing layers 80 (nickel and gold for example) are possibly deposited onto the front face 6 via electroplating onto at least a part of the patterns 62 (FIG. 2l).

Figure 3B:
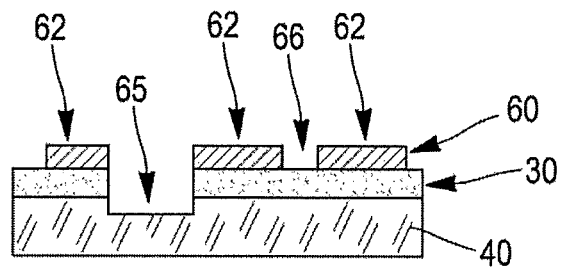

During a step illustrated in FIG. 3, a portion of the stratum formed by the layer of dielectric material 30 is removed over its entire thickness, for example at one of the spaces 64, by means of a laser beam 200 (see FIG. 3*a*). The laser beam 200 is for example a UV laser, emitting for example at 355 nm. The laser beam has, for example, a power of between 1 and 10 watts. For example, its power is 2 watts for the UV laser mentioned above. It emits a beam of which the frequency is, for example, between 40 and 140 kHz. For example, this frequency is 80 KHz for the UV laser mentioned above.

The length of the laser pulses is, for example, 10 microns for the UV laser mentioned above. The diameter of the beam is, for example, between 3 and 50 microns. For example, this diameter is 40 microns for the UV laser mentioned above. It may be noted that a UV laser is more suitable for etching fine patterns (between the contact lands 15) than an infrared laser for example. However, when the layers and strata to be etched are formed from an organic material, an infrared laser may be suitable. In this case, the IR laser emits for example at 1065 nm and the diameter of its beam is for example between 80 and 300 microns. Part of the thickness of the dielectric substrate 40 maybe possibly also be eliminated in order to reveal its color clearly (that is to say in order not to leave any dielectric material which is of another color). There is then obtained, between some patterns 62, a zone 65 having the color corresponding to that of the dielectric substrate 40 and, between other patterns 62, a zone 66 having the color corresponding to that of the first layer of dielectric material 30 (see FIG. 3*b*). In the zone 65, in FIG. 3*b*, the dielectric material 30 has been removed over the entire surface lying between the patterns 62. According to a variant which has not been illustrated, only a portion of this surface could have been removed (by using a finer laser beam and/or by scanning a smaller area with the beam, for example), so as to obtain a twocolored zone 65.

In steps which have not been illustrated, a chip 100 is attached to the rear face of each module. Each chip 100 is connected, for example by conductive wires, through connection wells (such as the holes 42), at the bottom thereof, to contacts 15 (see FIG. 1). The chip and the conductive wires are encapsulated and the modules are individualized and transferred, each individually, into a cavity 4 of the card 1.

According to another embodiment of the method according to the invention, the latter comprises another step of coating with an adhesive material so as to form a second layer of dielectric material 31. This second layer of dielectric material 31 forms a stratum of a color other than that of the first layer of dielectric material 30. In other words, after the step described above in relation to FIG. 2*d*, a second layer of dielectric material 31 is deposited on the first layer of dielectric material 30 already at least partially covering the dielectric substrate 40. The thickness of the second layer of dielectric material 31 is, for example, between 10 and 70 μm after drying, and more preferably between 10 and 20 μm after drying, its thickness being, for example, 15 μm, to within a tolerance of 3 μm. The material of the second layer of dielectric material 31 is obtained, for example, according to a method similar or identical to that already described above in relation to FIGS. 2*a* and 2*b*.

The second layer of dielectric material 31 has a color different from that of the first layer of dielectric material 30 which lies beneath it and possibly also different from that of the dielectric substrate 40. Thus, three different-colored strata can potentially be obtained. Depending on the respective nature of the materials of the layers of dielectric material 30, 31, the second layer of dielectric material 31 is deposited on a layer of dielectric material 30 that may or may not already be crosslinked.

Steps similar or identical to those described above in relation to FIGS. 2*e* to 2*l* are then implemented.

Figure 4A:
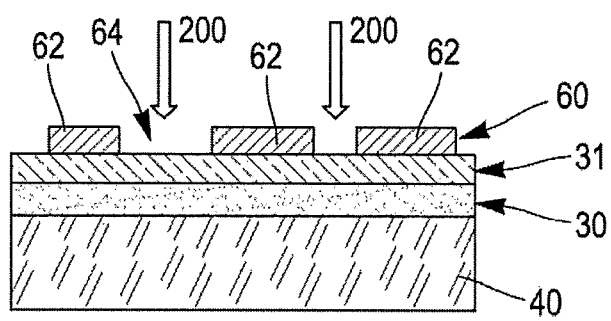
FIG. 4 schematically illustrates, in cross section, another example of a step of laser etching strata.

In a similar manner to the step described above in relation to FIG. 3, a portion of the second layer of dielectric material 31 is removed, for example, at a space 64, by means of a laser beam 200 (see FIG. 4*a*). The laser beam 200 has, for example, the same properties and parameters as those indicated above in relation to the description of FIG. 3. There are then obtained, between some patterns 62, zones 66 having the color corresponding to that of the first layer of dielectric material 30 and, between other patterns 62, zones 67 having the color corresponding to that of the second layer of dielectric material 31. Next, at least in one of the zones 66 from which a portion of the second layer of dielectric material 31 has already been removed, a portion of the first layer of dielectric material 30 is removed over its entire thickness to expose the underlying dielectric substrate 40. Zones 65 having the color corresponding to that of the dielectric substrate 40 are then obtained. For each of these etchings using the laser beam 200, a part of the thickness of the layer, the color of which it is desired to see, is possibly eliminated in order to reveal its color clearly (that is to say in order not to leave any dielectric material which is of another color).

Figure 4B:
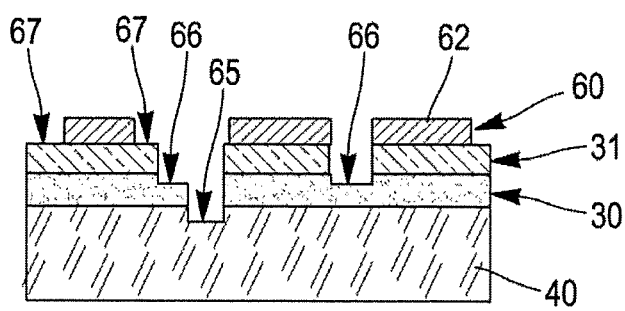

FIG. 4*b* depicts a zone between patterns 62, where the three colors, of, respectively, the dielectric substrate 40, the first layer of dielectric material 30, and the second layer of dielectric material 31, are visible. However, numerous variants can be envisaged in which only one or two of these three colors are revealed by etching using the laser beam 200.

As previously, in steps which have not been illustrated, a chip 100 is fixed to the rear face of each module. Each chip 100 is connected, for example by conductive wires, through connection wells (such as the holes 42), at the bottom thereof, to contacts 15. The chip and the conductive wires are encapsulated and the modules are individualized and transferred, each individually, into a cavity 4 of the card 1.

According to yet another embodiment of the method according to the invention, provision is made, between the steps described in relation respectively to FIGS. 2*c* and 2*d*, for a reinforcing layer 68 to be deposited on the dielectric substrate 40 before it is coated with one or more layers of dielectric material 30, 31. The reinforcing layer 68 is, for example, formed, like the layer or layers of dielectric material 30, 31, of a phenolic or epoxy resin. The reinforcing layer 68 is optionally also filled with glass or silica beads. Its thickness is, for example, between 10 and 20 microns, to within plus or minus 3 microns. The reinforcing layer 68 may itself be a layer of adhesive dielectric material having rheological properties enabling it not to creep or to creep only a little during the lamination of the assembly of layers that form the complex material. The reinforcing layer 68 may be UV-cured to achieve in-line curing leading either to intermediate curing or to a fully cured state. This makes it possible to limit the waiting time before depositing another layer on it. The reinforcing layer 68 may also be colored, luminescent or phosphorescent, just like the layers of dielectric material 30, 31 or the dielectric substrate 40 which have already been described.

The reinforcing layer 68 may notably have the following advantages: it may make it possible to limit the number of layers of dielectric material 30, 31 by itself forming a more rigid colored layer; it may also make it possible to shield at least partially the diffusion of heat (for example, during lamination of the layer of electrically conductive material 60) toward the layer or layers of dielectric material 30, 31 and thus limits the creep of the layers of dielectric material 30, 31 which are more likely to creep under the effect of heat. This improves the mechanical properties of the complex material which results from the lamination of the dielectric substrate, of the layer or layers of dielectric material 30, 31, and of the layer of electrically conductive material 60, with a view to improving the reliability of the electrical connection of the chip to the contacts 15 formed in the layer of electrically conductive material 60, by means of holes 42 (blind holes or plated through-holes).

The subsequent steps (coating with the layer or layers of adhesive dielectric material, perforation, formation of a layer of electrically conductive material, crosslinking of the layer or layers of adhesive dielectric material, formation of contacts and patterns, laser etching of the layers underlying the layer of electrically conductive material, attaching and connecting a chip, encapsulating the chip, etc.) are identical or similar to those described above.

FIG. 6 schematically depicts an example of a smart card module 2 obtained by implementing a method similar to those described above in relation to FIGS. 4 and 5. This module is seen from its front face. In one of these contacts 15, rings 69 are made, thus corresponding to zones in which the layer of electrically conductive material has been removed (electrochemical method or by laser beam) in order to reveal the underlying layer of dielectric material. Next, the different strata of adhesive dielectric material, reinforcement and/or dielectric substrate are laser etched in order to obtain the blue, yellow, black, green and red colors of the Olympic rings. Of course, many other colored patterns can be obtained using the method for manufacturing flexible printed circuits for smart card modules according to the invention.

According to other embodiments of the invention, the revealing of different colors by laser etching can be carried out on various multilayer substrates. Thus, a multilayer substrate can be obtained by colamination of several layers (for example 2 or 3) of prepreg, each of these layers of prepreg having a color different from that of the other layers of prepreg. For example, each layer of prepreg is formed of a colored epoxy resin and its thickness is between 50 and 75 microns. The resulting substrate has, for example, a thickness of between 100 and 150 microns. Alternatively, a multilayer substrate may be obtained by coextrusion of several layers. For example, each layer is made of a plastic material such as colored PET (polyethylene terephthalate) and has a thickness of between 50 and 75 microns.

Whatever the embodiment, the complex material comprising the various layers of dielectric material (substrate 40, layers 30, 31, reinforcing layer 68, etc.) and the layer or layers of electrically conductive material 60 preferably has a maximum thickness of 250 µm (for example this thickness is fixed at 227 µm+/−20).

The invention claimed is:

1. A method for manufacturing flexible printed circuits for smart card modules wherein a complex material is provided,
said complex material being in the form of a thin board or strip, with two main faces and being flexible so as to be able to be curved in a direction perpendicular to its main faces, this complex material forming an assembly comprising at least two different-colored strata of dielectric material, and
this complex material further comprising at least one layer of electrically conductive material in contact with one stratum of the assembly comprising at least two different-colored strata of dielectric material, this stratum containing an epoxy resin, contacts being formed in the layer of electrically conductive material, these contacts being intended to establish an electrical connection with a smart card reader, the assembly comprising at least two different-colored strata of dielectric material being visible through the layer of electrically conductive material in at least one zone,
this manufacturing method being characterized in that it comprises an operation that consists in laser etching at least one of the two different-colored strata over a portion of that zone of the assembly comprising at least two different-colored strata of dielectric material that is left visible, so as to reveal the color of the other of the two different-colored strata.

2. The method for manufacturing flexible printed circuits for smart card modules as claimed in claim 1, wherein the assembly comprising at least two different-colored strata of dielectric material comprises a dielectric substrate with at least one layer of dielectric material deposited on one of the main faces of the dielectric substrate.

3. The method for manufacturing flexible printed circuits for smart card modules as claimed in claim 1, wherein the zone of the assembly comprising at least two different-colored strata of dielectric material that is left visible is obtained by laser etching of the layer of electrically conductive material.

4. The method for manufacturing flexible printed circuits for smart card modules as claimed in claim 1, wherein the zone of the assembly comprising at least two different-colored strata of dielectric material that is left visible is obtained by photolithography and electrochemical etching of the layer of electrically conductive material.

5. The method for manufacturing flexible printed circuits for smart card modules as claimed in claim 1, comprising a step of punching holes through the assembly comprising at least two different-colored strata of dielectric material, prior to a step of laminating the layer of electrically conductive material, during which step at least some of the holes are at least partially blinded by the layer of electrically conductive material in order to form blind holes or holes that are rendered conductive by electroplating of a conductive material on their respective wall.

6. The method for manufacturing flexible printed circuits for smart card modules as claimed in claim 1, wherein the assembly comprising at least two different-colored strata of dielectric material is produced by depositing at least one reinforcing layer between two strata.

7. A printed circuit for a smart card module comprising a complex material having two main faces, this complex material forming an assembly comprising at least two different-colored strata of dielectric material and further comprising at least one layer of electrically conductive material in contact with one stratum of the assembly comprising at least two different-colored strata of dielectric material, this stratum containing an epoxy resin, in which layer of electrically conductive material there are formed contacts intended to establish an electrical connection with a smart card reader, and between which contacts the assembly comprising at least two different-colored strata of dielectric material is visible in at least two zones,
characterized in that it comprises at least the color of one of said at least two different-colored strata of dielectric material, in one of the two zones that are left visible, and at least the color of one of said at least two different-colored strata of dielectric material in the other of the two zones that are left visible.

8. The printed circuit as claimed in claim 7, wherein the complex material comprises a flexible dielectric substrate and at least one layer of adhesive dielectric material resting on the dielectric substrate.

9. The printed circuit as claimed in claim 7, wherein the complex material comprises a flexible dielectric substrate, at least one layer of adhesive dielectric material and at least one reinforcing layer inserted between the flexible dielectric substrate and the layer of adhesive dielectric material.

10. The printed circuit as claimed in claim 8, wherein the complex material comprises at least two layers of adhesive dielectric material of different apparent colors.

11. The printed circuit as claimed in claim 8, wherein each layer of adhesive dielectric material has a thickness greater than or equal to 7 microns.

12. A smart card module comprising a printed circuit as claimed in claim 7, comprising an electronic chip and holes punched through the thickness of the assembly comprising the substrate and the layer or layers of dielectric material and at least partially blinded by the layer of electrically conductive material, the chip being connected via these holes to contacts formed in the layer of electrically conductive material.

13. The module as claimed in claim 12, wherein the complex material comprises more than one layer of adhesive dielectric material, each layer of adhesive dielectric material having a different color.

14. A smart card comprising a card body, a cavity formed in the card body and a module housed in the cavity, this module comprising a printed circuit as claimed in claim 7, the total thickness of the module being less than or equal to 580 µm.

15. A printed circuit for a smart card module comprising:

a first strata of dielectric material having a first color, where the first strata of dielectric material comprises an epoxy resin;

a different second strata of dielectric material having a different second color, where the first strata of dielectric material and the second strata of dielectric material form a flexible assembly; and a layer of electrically conductive material in contact with the first strata of dielectric material, where the layer of electrically conductive material forms electrical contacts for connecting with a smart card reader, where the assembly comprises a first zone between a first set of the electrical contacts and a second zone between a second set of the electrical contacts, where the first color of the first strata of dielectric material is visible between the first set of the electrical contacts in the first zone, and where the different second color of the different second strata of dielectric material is visible between the second set of the electrical contacts in the second zone.

16. The printed circuit for a smart card module as claimed in claim 15 where the flexible assembly comprises a third strata of dielectric material having a first color, where the assembly comprises a third zone between at least some of the electrical contacts where the third color of the third strata of dielectric material is visible between the at least some of the electrical contacts in the third zone.

* * * * *